(12) United States Patent
Tseng

(10) Patent No.: US 7,329,925 B2
(45) Date of Patent: Feb. 12, 2008

(54) DEVICE FOR ELECTROSTATIC DISCHARGE PROTECTION

(75) Inventor: Jen-Chou Tseng, Hsin-Chu (TW)

(73) Assignee: Winbond Electronics Corporation, Hsinchu (TW)

( * ) Notice: Subject to any disclaimer, the term of this patent is extended or adjusted under 35 U.S.C. 154(b) by 3 days.

(21) Appl. No.: 11/325,377

(22) Filed: Jan. 5, 2006

(65) Prior Publication Data
US 2007/0045743 A1    Mar. 1, 2007

(30) Foreign Application Priority Data
Jul. 22, 2005    (TW) .............................. 94125036 A

(51) Int. Cl.
| | |
|---|---|
| H01L 23/62 | (2006.01) |
| H01L 29/00 | (2006.01) |
| H01L 29/72 | (2006.01) |
| H01L 29/74 | (2006.01) |
| H01L 31/111 | (2006.01) |

(52) U.S. Cl. ............... 257/355; 257/173; 257/174; 257/361; 257/362; 257/363; 257/557; 257/558; 257/559; 257/560; 257/561; 257/562

(58) Field of Classification Search ........ 257/361–362, 257/557–582, 173–174, 355, 363
See application file for complete search history.

(56) References Cited

U.S. PATENT DOCUMENTS

| | | | |
|---|---|---|---|
| 5,670,799 A | * | 9/1997 | Croft ........................... 257/173 |
| 5,763,918 A | * | 6/1998 | El-Kareh et al. ............ 257/355 |
| 5,804,861 A | * | 9/1998 | Leach ........................ 257/362 |
| 5,903,420 A | * | 5/1999 | Ham ............................ 361/56 |
| 6,060,752 A | * | 5/2000 | Williams ..................... 257/355 |
| 6,124,618 A | * | 9/2000 | Wong et al. ................. 257/370 |
| 6,310,379 B1 | * | 10/2001 | Andresen et al. ........... 257/355 |
| 6,424,013 B1 | * | 7/2002 | Steinhoff et al. ........... 257/355 |
| 6,635,931 B1 | * | 10/2003 | Wang .......................... 257/355 |
| 6,657,835 B2 | * | 12/2003 | Ker et al. ...................... 361/56 |
| 7,067,852 B1 | * | 6/2006 | Vashchenko et al. ........ 257/173 |
| 2003/0147190 A1 | * | 8/2003 | Ker et al. ...................... 361/56 |
| 2005/0248891 A1 | * | 11/2005 | Ker et al. ...................... 361/56 |
| 2005/0275027 A1 | * | 12/2005 | Mallikarjunaswamy ..... 257/355 |
| 2006/0151836 A1 | * | 7/2006 | Salcedo et al. ............. 257/362 |
| 2006/0278930 A1 | * | 12/2006 | Huang ........................ 257/361 |

* cited by examiner

Primary Examiner—Ida M. Soward
(74) Attorney, Agent, or Firm—Bacon & Thomas, PLLC

(57) ABSTRACT

A device for electrostatic discharge (ESD) protection is disclosed. The device for electrostatic discharge protection includes a lateral bipolar transistor and a diode. The semiconductor transistor has an emitter, a base and a collector electrically connected to a first power line (such as $V_{dd}$), a second power line (such as $V_{ss}$) and a bond pad of an integrated circuit respectively. The diode has an n electrode and a p electrode electrically connected to the first power line and the bond pad respectively.

5 Claims, 5 Drawing Sheets

DEVICE FOR ELECTROSTATIC DISCHARGE PROTECTION

BACKGROUND OF THE INVENTION

1. Field of the Invention

The present invention relates to a device for electrostatic discharge (ESD) protection, and more particularly to a device for electrostatic discharge (ESD) protection with upgraded electrostatic discharge immunity when a reverse bias voltage is applied.

2. Description of the Related Art

Integrated circuit is frail and easy to be damaged during electrostatic discharge. Even though it maybe just a minor and temporary feeling for human body during electrostatic discharge, the damage resulting from the electrostatic discharge is unrecoverable and permanent. Electrostatic discharge could be present any moment during the manufacture process of integrated circuit chip, most of electrostatic discharge are present during the processes of forming integrated circuits on wafers or the stage of integrated circuit package.

In order to keep integrated circuits from being damaged by electrostatic discharge, additional devices are utilized to conduct hazardous electrostatic charges. These additional devices should not cause any harmful influence to the operation of the integrated circuit. Conventional devices include fuses, diodes or more complicated circuits such as grounded N type metal oxide semiconductor transistors or bipolar transistors.

FIG. 1 shows a conventional device for electrostatic discharge protecting integrated circuit. Diodes 106 and 108 for electrostatic discharge protection connect to a first power line to $V_{dd}$ and a second power line to $V_{ss}$ ground respectively, wherein the diodes 106 and 108 are P+/N well diode and N+/P well diode. The diodes 106 and 108 connect between a bond pad 102 and an integrated circuit 104. The diodes 106 and 108 provide an electrostatic discharge path to release large amount of electrostatic charges. FIG. 2 shows a cross-sectional view of a conventional device for protecting integrated circuit from electrostatic discharge damage. The diode 106 comprises N+ diffusion region 204, P+ diffusion region 206 and N well 202. FIG. 2 also shows guard ring surrounding diodes as P+ diffusion regions 210 and 212. The conventional device for electrostatic discharge protection shown in FIGS. 1 and 2 has a drawback, which is the limited electrostatic discharge immunity under a reverse bias voltage. The areas occupied by the diodes 106 and 108 must be increased as large as possible in order to effectively release electrostatic current especially under ND mode and NS mode. However, a large layout area will be used or occupied in order to achieve this purpose. Therefore, it is a dilemma of maintaining the performance of the device for electrostatic discharge protection or saving the layout area of the integrated circuit being protected, and a compromise must be made between the performance of the device for electrostatic discharge protection and the layout area of the integrated circuit being protected. It is toward these goals that the present invention is specifically directed.

SUMMARY OF THE INVENTION

It is therefore an object of the invention to provide a device for electrostatic discharge protection to maintain the performance of the device for electrostatic discharge protection and save the layout area of the integrated circuit.

It is another object of this invention to provide a device for electrostatic discharge protection to upgrade electrostatic discharge immunity thereof under a reverse bias voltage mode.

To achieve these objects, and in accordance with the purpose of the invention, the invention discloses a device for electrostatic discharge protection. The device for electrostatic discharge protection comprises a semiconductor transistor and a diode. The semiconductor transistor has an emitter, a base and a collector electrically connected to a first power line (such as $V_{dd}$), a second power line (such as $V_{ss}$) and a bond pad of an integrated circuit respectively, wherein the semiconductor transistor comprises a lateral bipolar transistor. The diode has an n electrode and a p electrode electrically connected to the first power line and the bond pad respectively.

It is to be understood that both the foregoing general description and the following detailed description are exemplary and explanatory only and are not restrictive of the invention, as claimed.

BRIEF DESCRIPTION OF THE DRAWINGS

The present invention is best understood by reference to the following detailed description when read in conjunction with the accompanying drawings.

DESCRIPTION OF THE PREFERRED EMBODIMENT

It is to be understood and appreciated that the circuit described below do not cover a complete circuit layout. The present invention can be practiced in conjunction with various circuit techniques that are used in the art, and only so much of the commonly practiced techniques are included herein to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

In one embodiment of the invention, the device for electrostatic discharge for protection of the invention further includes an N+ diffusion ring into a P well, wherein the N+ diffusion ring connects to a bond pad between the cathode of a diode and a P+ guard ring to for a parasitic lateral npn bipolar transistor and an N+/P well diode so as to upgrade the performance of the device for electrostatic discharge protection under ND and NS modes without degrading the performance of the same under PD and PS modes. Moreover, comparing to the conventional device for electrostatic discharge protection shown in FIGS. 1 and 2, the device for electrostatic discharge protection of the invention can save 50% area of total occupied layout area of the conventional device for electrostatic discharge protection.

Figure 3:
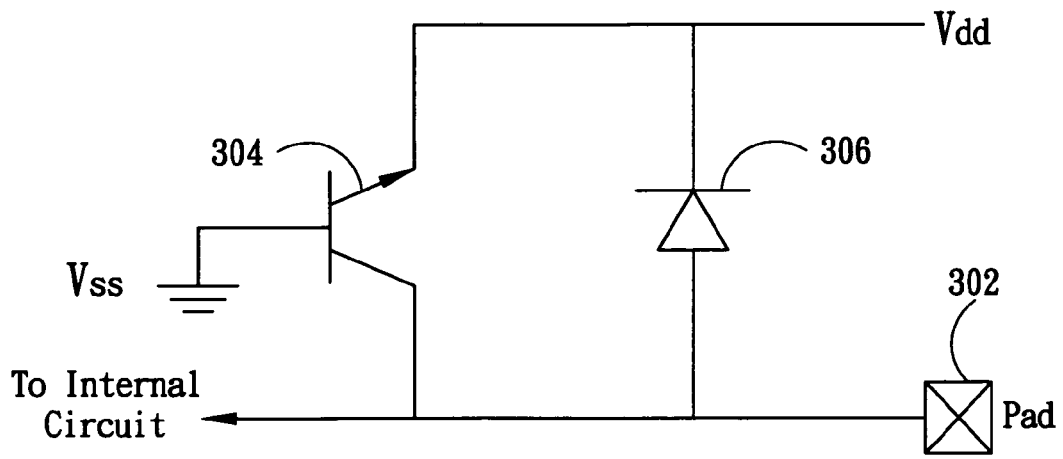
FIG. 3 shows an equivalent circuit of the device for electrostatic discharge protection of the invention.
Figure 4:
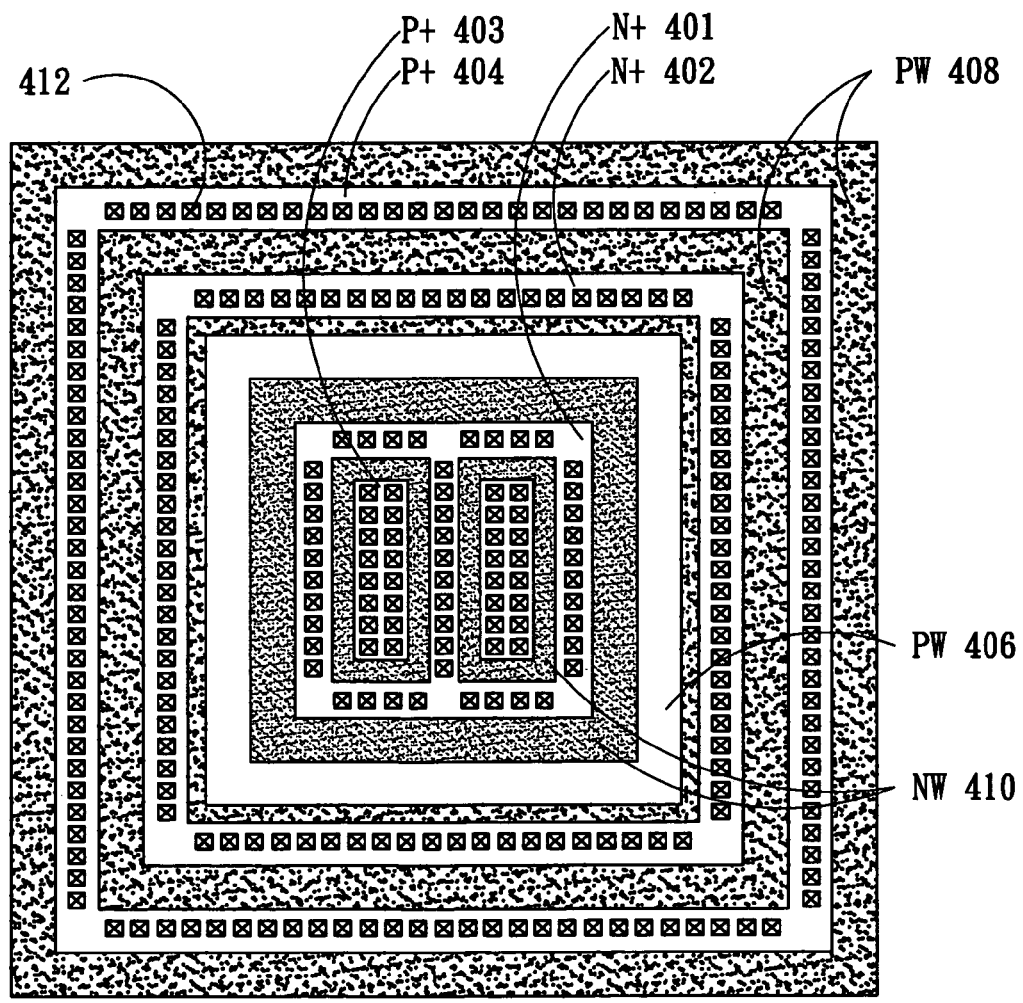
FIG. 4 shows the layout of the equivalent circuit of the device for electrostatic discharge protection of the invention.

Referring to FIG. 3, an equivalent circuit of the device for electrostatic discharge protection of the invention is shown. The circuit shown in FIG. 3 uses a diode 306 and an npn bipolar transistor 304 as pull up paths and a parasitic diode (N+/P well) as pull down paths to release electrostatic charges in input/output pad 302 so that the device for electrostatic discharge protection of the invention can save more than 50% area of total occupied layout area of the conventional device for electrostatic discharge protection. FIG. 4 shows the layout of the equivalent circuit of the device for electrostatic discharge protection of the invention which includes N+ diffusion regions 401 and 402, P+ diffusion regions 403 and 404, a P well 406 comprising a low voltage P well, a P well 408 comprising a high voltage P well, an N well 410 comprising a low voltage N well and contacts 412. The N+ diffusion region 401 is a cathode of N+ diffusion ring of a diode and the P+ diffusion regions 403 and 404 are an anode of the diode and a P+ guard ring respectively. The N+ diffusion region 402 is a N+ diffusion ring located between the N+ diffusion region 401 or the cathode of N+ diffusion ring of the diode and the P+ diffusion region 403 or the anode of the diode and the P+ diffusion region 404 or the P+ guard ring.

Figure 5:
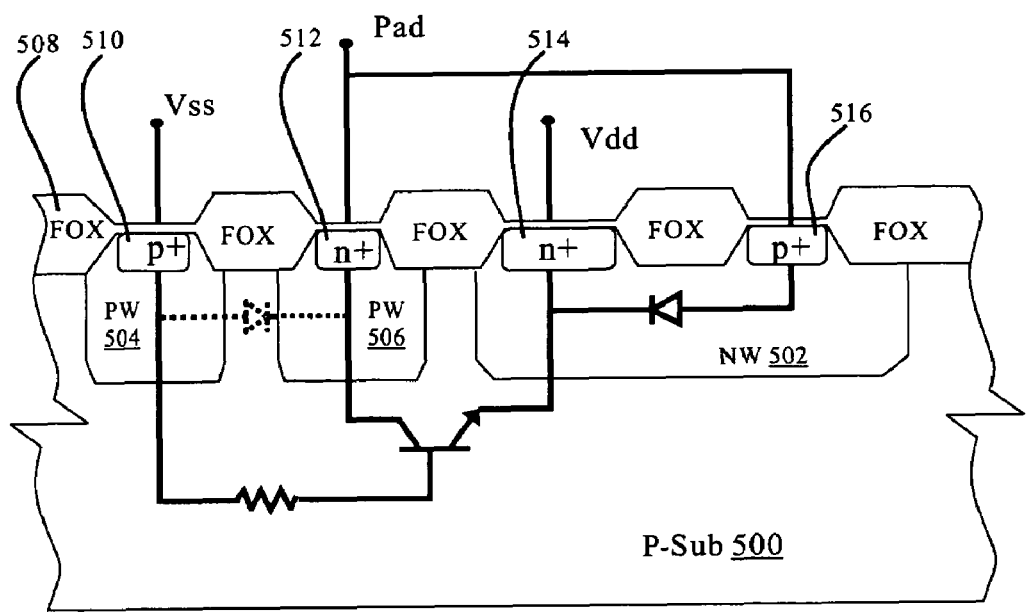
FIG. 5 shows a cross-sectional view of the device for electrostatic protection of the invention.

FIG. 5 shows a cross-sectional view of the device for electrostatic protection of the invention. The device for electrostatic discharge protection of the invention includes a diode comprising a P+ diffusion region 516 and an N+ diffusion region 514 and N well 502, an npn bipolar transistor comprising an N+ diffusion region 512, P well 506, a P+ diffusion region 510, a P well 504, a P type substrate 500, an N well 502 and an N+ diffusion region 514, and a parasitic diode comprising the P+ diffusion region 510, the P well 504, the P type substrate 500, the P well 506, and the N+ diffusion region 512. The N+ diffusion region 514 and the P+ diffusion region 510 connect to a first power line such as a $V_{dd}$ line and a second power line such as a $V_{ss}$ line to ground respectively, while the N+ diffusion region 512 and the P+ diffusion region 516 connect to the bond pad. Field oxide regions 508 and the resistor of the P type substrate 500 are also shown. Field oxide regions 508 is an example only, other isolations such as shallow trench isolations used in the art can also be used. The N+ diffusion region 512 is a N+ diffusion ring located between the N+ diffusion region 514 which is the cathode of N+ diffusion ring of the diode and the P+ diffusion region 510 which is the P+ guard ring.

In summery, the device for electrostatic discharge protection comprises a semiconductor transistor having an emitter, a base and a collector electrically connecting to a first power line, a second power line and a bond pad of an integrated circuit respectively, wherein the semiconductor transistor comprises a lateral bipolar transistor; and a diode having an N electrode and a P electrode electrically connecting to the first power line and the bond pad respectively. The semiconductor transistor is formed in a P type semiconductor substrate, the semiconductor transistor includes a P+ diffusion region base, an N+ diffusion region collector and an N+ diffusion region emitter electrically connecting to the second power line, the bond pad and the first power line, the N electrode is the N+ diffusion region emitter and the P electrode includes a P+ diffusion region connecting to the bond pad. The P+ diffusion region base, the N+ diffusion region collector are formed in two adjacent P wells, the P wells are isolated by a field oxide region and form a parasitic diode in the P type semiconductor substrate. The device N+ diffusion region emitter is formed in an N well adjacent the P well including the N+ diffusion region collector. The P+ diffusion region of the P electrode is formed in the N well, the P+ diffusion region of the P electrode and the N+ diffusion region emitter are isolated by a field oxide region.

Table 1 shows test results and the performance comparison of Human Body Model (HBM) and Transmission Line Pulsing (TLP) of conventional devices for electrostatic discharge protection and the device for electrostatic discharge protection of the invention.

TABLE 1

| device | 1<br>Conventional<br>P+/N well<br>diode (1) | 2<br>Conventional<br>P+/N well<br>diode (2) | 3<br>Device for<br>electrostatic<br>discharge<br>protection of<br>the invention |
|---|---|---|---|
| Split (Anode contact to T.O. edge) | 0.5 um | 3 um | 0.5 um |
| BV (1 uA) | −11.9 | −12.5 | −12.5 |
| HBM avg | −0.95 | −1.25 | −4.7 |
| min. | −0.75 | −1.25 | −4.25 |
| Center | −1 | −1.25 | −5 |
| Down | −0.75 | −1.25 | −4.5 |
| Right | −1 | −1.25 | −5 |
| Up | −1 | −1.25 | −4.75 |
| Left | −1 | −1.25 | −4.25 |
| It1 | | 6.80E−04 | 4.20E−03 |
| Vt1 | 12.76 | 11.6 | 12.9 |
| Ih | | | 0.94 |
| Vh | | | 15.1 |
| It2 | 0.404 | 0.46 | 1.17 |
| Vt2 | 67.98 | 80.5 | 16.1 |
| Ron | 138.6 | 149.7 | 2.74 |
| It2 * (Ron + 1.5k) | 0.66 | 0.76 | 1.76 |
| HBM avg | 8 | 8 | 8 |
| min. | 8 | 8 | 8 |
| Center | 8 | 8 | 8 |
| Down | 8 | 8 | 8 |

Figure 1:
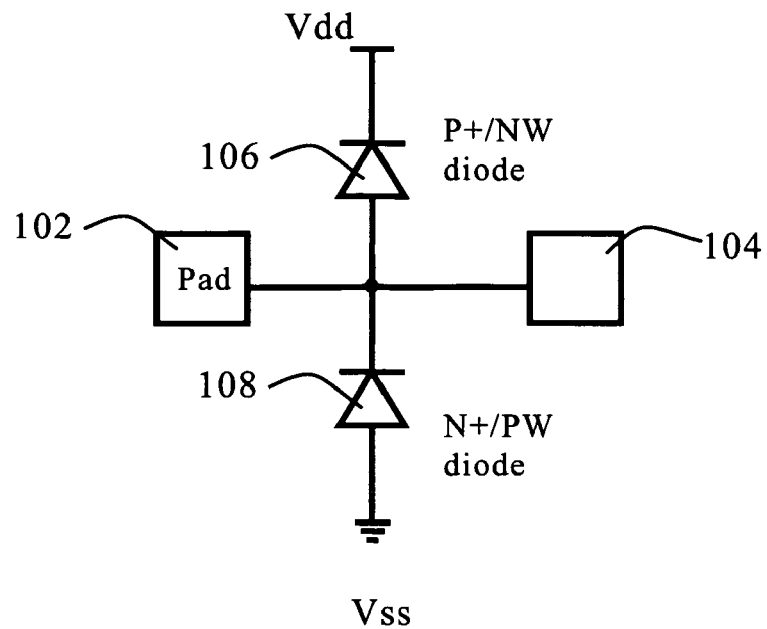
FIG. 1 shows a conventional device for electrostatic discharge protection.
Figure 2:
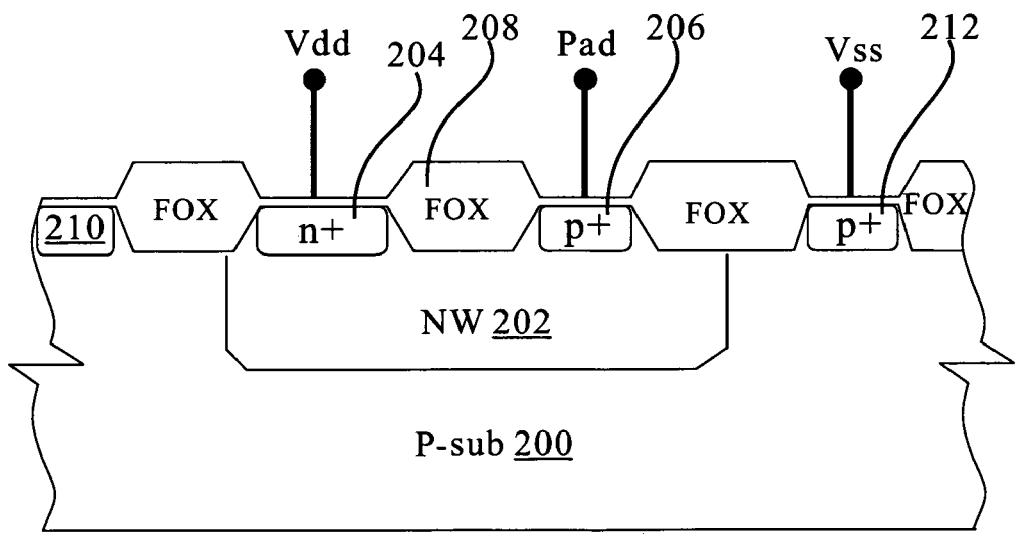
FIG. 2 shows a cross-sectional view of the conventional pull up device for protecting integrated circuit from electrostatic discharge damage shown in FIG. 1.
Figure 6:
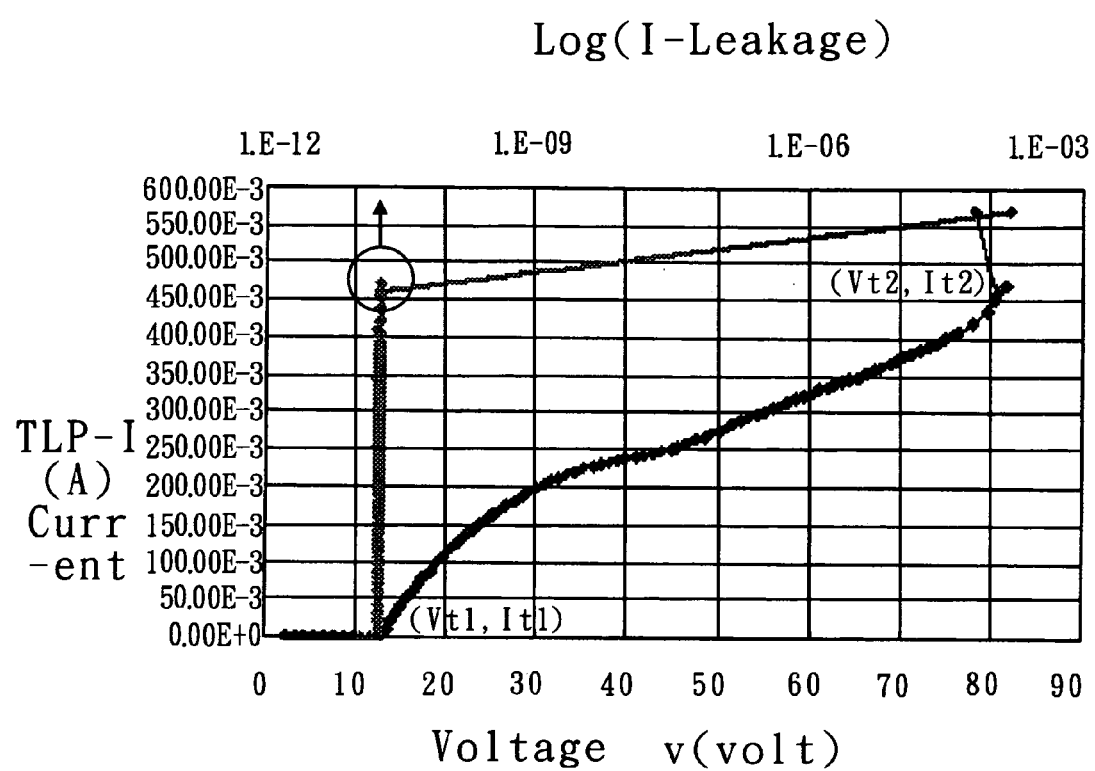
FIGS. 6 and 7 show Transmission Line Pulsing (TLP) I-V curves of the conventional devices for electrostatic discharge protection and the device for electrostatic discharge protection of the invention.
Figure 7:
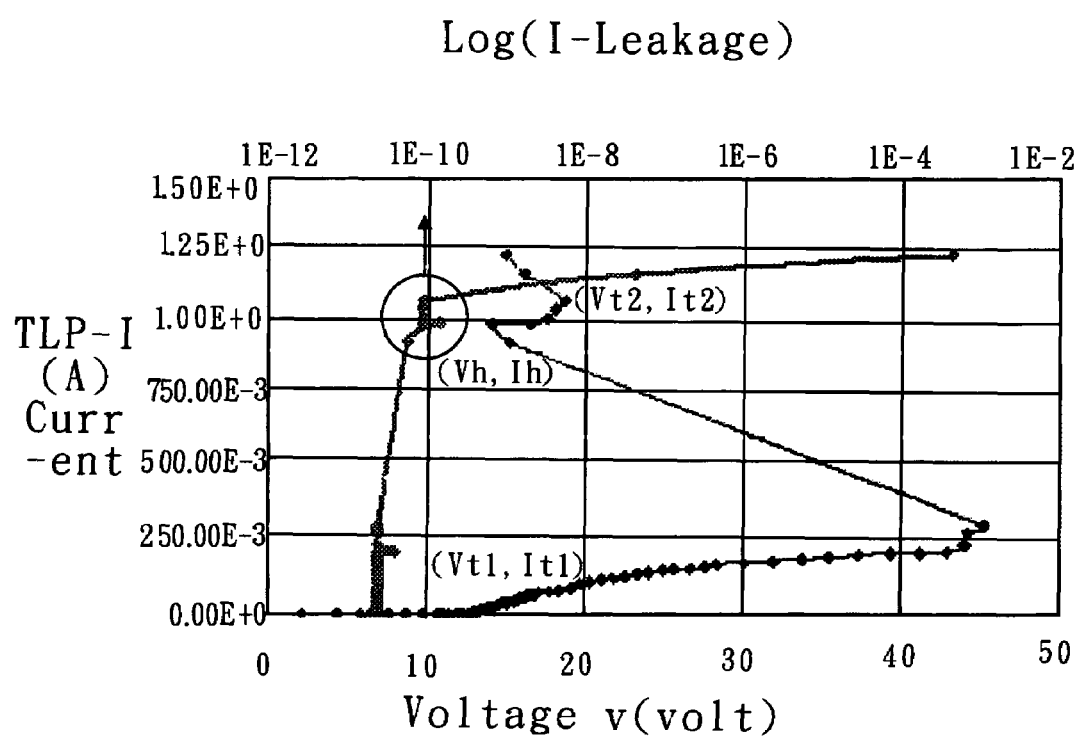

FIGS. 6 and 7 show Transmission Line Pulsing (TLP) I-V curves of the conventional devices for electrostatic discharge protection such as the diode 106 shown in FIGS. 1 and 2 and the device for electrostatic discharge protection of the invention respectively. FIG. 6 shows the TLP I-V curves of the typical P+/NW diode (2) in Table 1. Vt1 and It1 of the typical P+/NW diode (2) are 11.6 and 6.8E-04 while Vt2 and It2 thereof are 80.5 and 0.46 or 460.00E-3. FIG. 7 shows the TLP I-V curves of pull up device for electrostatic discharge protection of the invention. Vt1 and It1 of the pull up device of the invention are 12.9 and 4.2E-03 while Vt2 and It2 thereof are 16.1 and 1.17 and Vh and Ih are 15.1 and 0.94 as a result of the snap-back due to the turn on of the npn transistor. The electrostatic discharge immunity of the device for electrostatic discharge protection of the invention under a reverse bias voltage mode is upgraded from −0.75 kV to −4.25 kV owing to the snap-back arose by the lateral npn bipolar transistor.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A device for electrostatic discharge protection, said device for electrostatic discharge protection comprising:
   a semiconductor transistor formed in a P type semiconductor substrate, said semiconductor transistor having an N+ diffusion region emitter, a P+ diffusion region base and an N+ diffusion region collector electrically connecting to a first power line, a second power line and a bond pad of an integrated circuit respectively, wherein said semiconductor transistor comprises a lateral bipolar; and
   a diode having said N+ diffusion region emitter as an N electrode and a P electrode including a P+ diffusion region, said N electrode and P electrode electrically connecting to said first power line and said bond pad respectively;
   wherein said P+ diffusion region base and said N+ diffusion region collector are formed in two adjacent P wells isolated by a field oxide region, and thus construct a parasitic diode in said P type semiconductor substrate.

2. The device for electrostatic discharge protection according to claim 1, wherein said N+ diffusion region emitter is formed in an N well adjacent to one of said two adjacent P wells that includes said N+ diffusion region collector.

3. The device for electrostatic discharge protection according to claim 2, wherein said P+ diffusion region of said P electrode is formed in said N well, said P+ diffusion region of said P electrode and said N+ diffusion region emitter are isolated by said field oxide region.

4. The device for electrostatic discharge protection according to claim 1, wherein said first power line comprises a $V_{dd}$ line.

5. The device for electrostatic discharge protection according to claim 1, wherein said second power line comprises a $V_{ss}$ line.

* * * * *